United States Patent [19]
Sakurai

[11] Patent Number: 5,273,917
[45] Date of Patent: Dec. 28, 1993

[54] METHOD FOR MANUFACTURING A CONDUCTIVITY MODULATION MOSFET

[75] Inventor: Kenya Sakurai, Kawasaki, Japan

[73] Assignee: Fuji Electric Co., Ltd., Kanagawa, Japan

[21] Appl. No.: 815,761

[22] Filed: Jan. 2, 1992

Related U.S. Application Data

[62] Division of Ser. No. 565,370, Aug. 10, 1990, abandoned.

[30] Foreign Application Priority Data

Aug. 19, 1989 [JP] Japan ................................ 1-213968
Mar. 5, 1990 [JP] Japan ................................ 2-53085

[51] Int. Cl.$^5$ .......................................... H01L 21/265
[52] U.S. Cl. ...................................... 437/40; 437/225; 437/913; 437/974; 148/DIG. 12; 148/DIG. 126
[58] Field of Search ................ 437/40, 913, 974, 225, 437/44; 148/DIG. 126, DIG. 12, DIG. 135, DIG. 150

[56] References Cited

U.S. PATENT DOCUMENTS 4,672,407 6/1987 Nakagawa et al. ............... 357/23.4
4,908,328 3/1990 Hu et al. ................... 148/DIG. 135
4,916,085 4/1990 Frisina ............................... 437/44
5,068,700 11/1991 Yamaguchi et al. .
5,183,769 2/1993 Rutter et al. ............. 148/DIG. 135

FOREIGN PATENT DOCUMENTS 1259539 10/1989 Japan ................................ 437/84
01290229 11/1989 Japan .

*Primary Examiner*—Brian E. Hearn
*Assistant Examiner*—Michael Trinh
*Attorney, Agent, or Firm*—Finnegan, Henderson, Farabow, Garrett & Dunner

[57] ABSTRACT

A conductivity modulation type MOSFET (IGBT) including an n-type high resistance layer, p-type base regions selectively formed in a first major surface of the high resistance layer, n-type source regions formed in the surface of each base region, a p+ well region formed in a central region of each of the base regions, a channel in the base region between one of the n-type source regions and the high resistance layer, a gate electrode formed above the channel, an emitter electrode formed in contact with the p+ well region and the n-type source region, a gate insulating film formed between the gate electrode and the channel, and a metal electrode formed in contact with a second major surface of the high resistance layer opposite the first major source, the electrode forming a Schottky barrier junction.

7 Claims, 4 Drawing Sheets

METHOD FOR MANUFACTURING A CONDUCTIVITY MODULATION MOSFET

This application is a division of application Ser. No. 07/565,370, filed Aug. 10, 1990, now abandoned.

BACKGROUND OF THE INVENTION

1. Filed of the Invention

The present invention relates to a conductivity modulation type MOSFET used as a power switching device.

2. Description of the Related Art

The market in power switching devices continues to demand performance characterized by high speed, high breakdown voltage, and high power. As a result, large power MOSFETs (insulated, large power MOSFETs) have found application as power switching devices and are rapidly replacing older components. A conductivity modulation type MOSFET (insulated gate bipolar transistor (IGBT)) is a switching device superior to a conventional bipolar transistor in breakdown voltage, power, and operating speed. The IGBT is used particularly in the field of invertor control, but its application is expanding to other fields.

A basic structure of an n-channel IGBT is shown in FIG. 2. The n-channel IGBT may be considered a high power MOSFET, a so called vertical DMOS, in which an n+ region serving as a drain region is replaced by a p+ collector region 1. Multiple p-base regions 3 are selectively formed in the surface region of an n− region 2 in contact with the p+ region 1. Two n+ source regions 4 are formed in the surface of each p-phase region 3. Additionally, a p+ well region 5, which extends deeper than the p region 3, is formed in the central portion of the p-base region 3. In order to form an n-channel in a p-base region 30 located between the exposed portions of the n+ source region 4 and the n− drift region 2, a gate electrode 7 is provided, which is connected through an insulating film 6 to a gate terminal G. An emitter electrode 8, which is connected to an emitter terminal E through a contact hole opened in the insulating film 6, is in contact with the p+ well 5 and the n+ source region 4. A collector electrode 9, which is connected to a collector terminal C, is connected to the p+ region 1. When the emitter terminal E of the IGBT is grounded, and a positive voltage potential is applied to the gate terminal G and the collector terminal C, the surface of the p-base layer 3 located just under the gate electrode 7 is inverted to form a channel of electrons on the same principle as that of the high power MOSFET. Under this condition, the n− region 2 is equivalently grounded and hole current is injected form the p+ collector region 1 into the n− region. In other words, minority carriers (holes) are injected into the high resistance layer n− region. The injection of the minority carriers increases the concentration of electrons so as to satisfy the charge neutrality condition, and significantly reduces resistance of the n− region. Thus, the IGBT serves as a power switching device of satisfactorily low ON-resistance because of the conductivity modulation effect.

Several problems are apparent in the present use of the IGBT as a power switching device.

As shown in FIG. 3, an emitter current $I_E$ is expressed by $$I_E = I_h + I_{MOS} \qquad (1)$$

Assuming that the current gain of a stray pnp bipolar transistor 21 consisting of the p-base region 3, n− drift region 2, and p+ collector region 1 is $\alpha_{PNP}$, the hole current $I_h$ is $$I_h = \{\alpha_{PNP}/(1-\alpha_{NPN})\}I_{MOS} \qquad (2)$$

where $I_{MOS}$ is electron current. Substituting equation (2) into equation (1) and rearranging results in $$I_E = \{1/(1-\alpha_{PNP})\}I_{MOS} \qquad (3)$$

As seen from equation (2), the hole current $I_h$, viz., the current of the IGBT, changes depending on the value of $\alpha_{PNP}$.

FIG. 4 is a graph showing a typical switching waveform of the bipolar transistor at the time it is turned OFF. As shown, the switching operation progresses through two phases. During a first phase 41, the channel disappears and electron current becomes zero. Accordingly, the current reduces by this amount. During a second phase 42, the current caused by the pn−p bipolar transistor diminishes because of the recombination of carriers left in the n− layer due to the carrier lifetime $\tau$ in an open base state. Accordingly, the second phase is determined by an injection level of the hole current or the carrier lifetime $\tau$;

To design the bipolar transistor operating at high frequency, a designer employs any of the following approaches: 1) The injection level of hole current is controlled. To this end, a buffer layer n+ layer is formed between the p+ substrate and the buffer n− high resistance region. (for example, see IEEE, IEDM Technical Digest, 4.3 (1983) pp. 79 to 82). 2) A concentration of the p+ substrate is controlled. 3) The carrier lifetime $\tau$ is reduced by using a lifetime control process, such as electron beam irradiation and heavy metal diffusion (For example, see IEEE, Trans. Electron Devices, ED-31 (1984) pp. 1790 to 1795). Each of these conventional approaches requires some trade-off with the ON-voltage of the bipolar transistor. The trade-off could be significantly reduced if a process existed to pull out the carrier to the p+ substrate region or to another electrode.

The IGBT has another problem in addition to a stray, pnp bipolar transistor 21. As shown in FIG. 3, another stray, npn bipolar transistor 22 exists. This npn bipolar transistor consists of an n+ source region 4, p-base region 3, and n− drift region 2. These stray transistors 21 and 22, have current gains $\alpha_{PNP}$ and $\alpha_{NPN}$, respectively, and cooperate to substantially form an npnp thyristor structure.

Accordingly, a so-called latching phenomenon can occur in which the thyristor turns on when the sum of the current gains is greater than or equal to 1, viz., $\alpha_{PNP} + \alpha_{PNP} \geq 1$. Once latching occurs, the IGBT loses gate control over the current and in extreme cases will be destroyed. These extreme cases of latching abruptly destroying the IGBT must be eliminated, particularly in the application of invertor control.

Typical measures thus far taken against the latching phenomenon are: 1) reducing base resistance in the p+ well 5 to check activation of the stray transistors (For example, see IEEE Trans. Electron Devices, ED-32 (1985), p2554), 2) reducing the majority carrier in the p-base layer 3, and 3) reducing current concentrated in the region near the emitter/base junction of the element (For example, see U.S. Pat. No. 4,809,045). Nevertheless, a destruction level (load short-circuiting mode) of an IGBT incorporating any of the above measure has not yet reached that of the conventional bipolar transistor. However, the risk of the latching phenomenon could be reduced if the current gain of either stray bipolar transistor 21 or 22 is markedly reduced.

SUMMARY OF THE INVENTION

An object of the present invention is to provide an improved IGBT with improved switching speed and trade-off of ON-voltage and current fall time. Another object of the present invention is to provide an improved IGBT in which the current gain of each stray bipolar transistor formed in the substrate is reduced to thereby prevent latching.

These and other objects are accomplished by a conductivity modulation type MOSFET having a first conductivity type high resistance layer, second conductivity type base regions selectively formed in a first major surface of the high resistance layer, first conductivity type source regions formed in the surface of each base region, a second conductivity type well region formed in a central region of each base region, a channel, in the base region, between one of the first conductivity type source regions and the high resistance conductivity layer, a gate electrode formed above the channel, a gate insulating film formed between the gate electrode and the channel, an emitter electrode formed in contact with the second conductivity type well region and the first conductivity type source region, and a metal electrode formed in contact with a second major surface of the high resistance layer opposite the first major surface, wherein the metal electrode forms a Schottky barrier junction.

BRIEF DESCRIPTION OF THE DRAWINGS

The accompanying drawings which are incorporated in and constitute a part of the specification, illustrate an embodiment on the invention and, together with the description, serve to explain the principles of the invention.

DESCRIPTION OF THE PREFERRED EMBODIMENT

Figure 1:
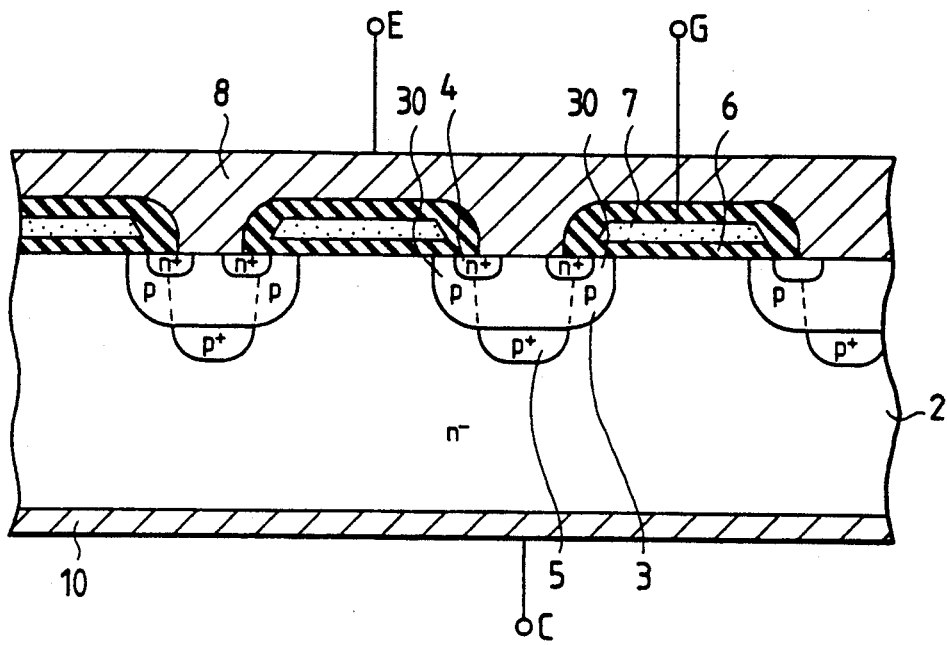
FIG. 1 is a sectional view of a portion of an IGBT according to an embodiment of the present invention.

Referring now to the drawings, FIG. 1 illustrates an embodiment of a conductivity modulation type MOSFET provided as a metal collector IGBT according to the present invention. Portions of the drawings that are equivalent to portions of FIG. 2 are designated by like reference numerals.

Figure 2:
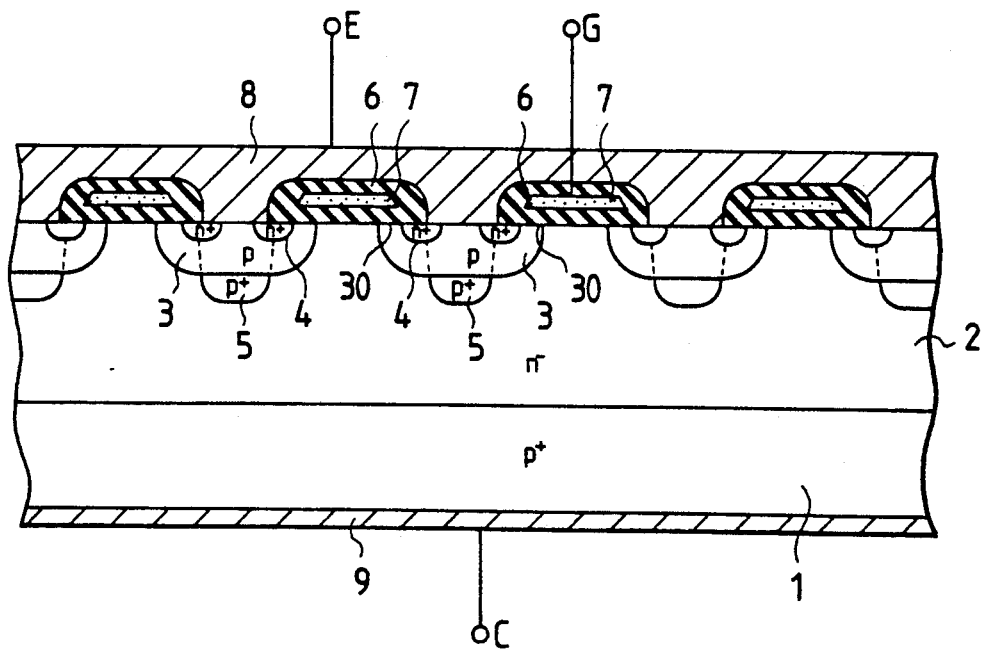
FIG. 2 is a sectional view of a portion of a conventional IGBT.
Figure 3:
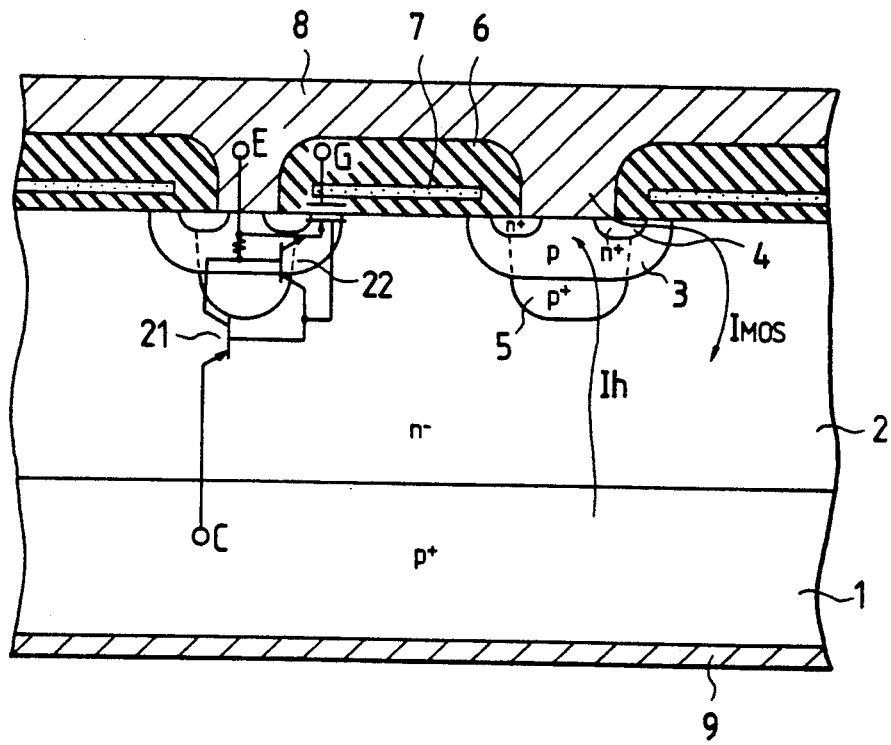
FIG. 3 is a sectional view of the IGBT of FIG. 2 in which current flows and equivalent circuits are depicted.
Figure 4:
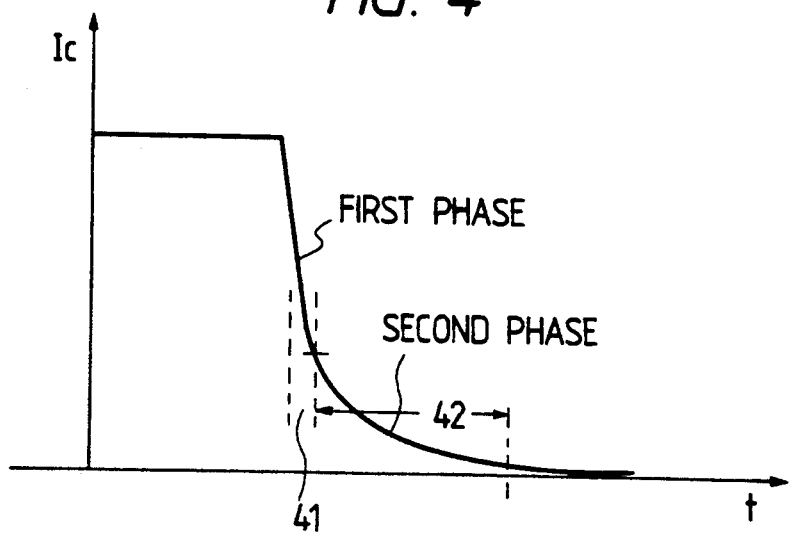
FIG. 4 is a graph showing a typical switching waveform of an IGBT at the time it is turned OFF.

In the embodiment shown in FIG. 1, a p-base region 3, n+ source region 4, and p+ well 5 are formed in the surface region of an n− high resistance region 2, as in the case of FIG. 2. A gate oxide film 6 and a polycrystalline silicon gate electrode 7 are formed on a major surface of the structure. On the other major surface, on the other side of the structure, a metal electrode 10 directly contacts the high resistance region 2 to form a Schottky barrier junction. An Ni-Au layer or Ni-Ag layer (not shown), which is solderable, is further layered on the metal electrode 10.

In accordance with the invention, the electrode in contact with the surface of the IGBT which is opposite to the surface containing the insulated gate structure, and the semiconductor substrate form a Schottky diode (SD). In an n-type SD, the majority carriers generated when the SD is forwardly biased are thermally emitted electrons. The current of the SD contains a current component of minority carriers resulting from the injection of holes from the metal side to the semiconductor side.

The article entitled "Metal-Semiconductor Contacts" by Rhode, describes that a hole current is expressed by $$J_h = (qD_h P_o/L) \times \{exp(qV/kT) - 1\} \quad (4)$$

In equation (4), $P_o = n_i^2/N_d$ where $n_i$ is the electron density and $N_d$ is a donor concentration in an intrinsic state. The term "q" designates an absolute value of electron charge quantity. $D_h$ is a diffusion coefficient of holes in bulk semiconductor. L is the thickness of a pseude neutral region of the bulk semiconductor.

A hole injection rate $\gamma_h$ as a ratio of minority carrier (hole) current $J_h$ to a total current J of the SD, $J = J_h + J_e$, is given by $$\gamma_h = \frac{J_h}{J_h + J_e} \approx \frac{J_h}{J_e} = \frac{qD_h n_i^2}{N_d L A^* T^2 \exp(-q\phi_b/kT)}$$

where $A^*$ is the effective Richardson coefficient.

In the general SD, $\phi_b$ is a barrier height and is nearly equal to 0.8 eV, $n_d$ is nearly equal to $10^{16}$ cm$^{-3}$, and L is nearly equal to $5 \times 10^{-4}$, and the injection of holes is generally negligible. For this reason, the SD is called a majority carrier device. According to the above, if the barrier height $\phi_b$ is high, and the $N_d$ concentration is low, $\gamma_h$ may be set at $10^{-2}$ or more. In other words, the injection of minority carrier can be realized by using a Schottky barrier. If minority carrier injection is possible, a conductivity modulation occurs in the n− high resistance region, and hence the on-voltage can be decreased. An injection level of the minority carrier can be controlled by the barrier height $\phi_b$ and the $N_d$ concentration. When the total current J flowing across the Schottky junction increases, the value of $\gamma_h$ also increased. Therefore, it can be expected that the minority carriers injected and the current can both be increased.

In the case of conventional IGBT such as described above, in a switch-OFF state the hole and electron carriers as stored in the n− high resistance region are equal to those in a switch-OFF state at the time of base opening in which a channel is not formed in a channel region beneath a gate electrode since a voltage is not applied to the gate electrode. Most of these carriers are restricted by the reduction due to carrier lifetime τ. In contrast, in the metal collector IGBT according to the present invention, electrons in the n− high resistance region are readily pulled to the drain electrode in the switch-Off state. A more rapid switching operation is realized for the following two reasons. First, a reduction the carrier lifetime $\tau$ in the n$^-$ high resistance region is less than that in the conventional IGBT. Second, a Schottky barrier voltage drop is smaller than a pn junction diffusion potential of the conventional IGBT.

The above described latching phenomenon experienced in the conventional IGBT is minimized in the metal collection IGBT of the invention by constructing one of the stray bipolar transistors to be a pn$^-$p bipolar transistor whose emitter is a Schottky junction. A current gain $\alpha$ of the pn$^-$p bipolar transistor of the Schottky type junction is less than that of the pn$^-$p bipolar transistor of the pn type junction as found in the conventional IGBT. Therefore, the metal collector IGBT of the invention suffers less from the latching phenomenon.

Figure 5:
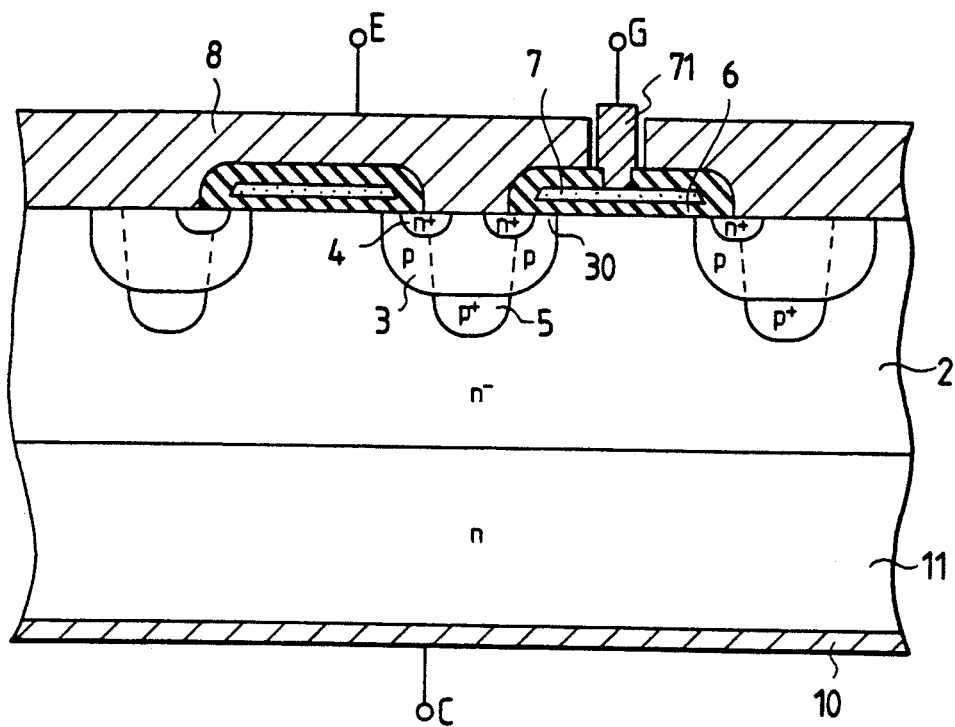
FIG. 5 is a sectional view of a portion of an IGBT according to another embodiment of the present invention.

FIG. 5 shows another embodiment of a metal collector IGBT according to the present invention. To obtain a breakdown voltage in a narrow n$^-$ high resistance region 2, a region 11 of n-type material of high impurity concentration in the range $10^{14}$ to $5 \times 10^{15}$ cm$^{-3}$ is positioned underneath the n$^-$ high resistance region 2. The n-region 11 is covered with a Schottky barrier metal film 10 as a collector electrode. The barrier metal may be any of Pd, Al, Pt, Pt silicide, Au, Mo, Mo silicide, Cr, Cr silicide, Ni, Ni silicide, Ti, and Ti silicide, and the like. If an injection amount of necessary minority carrier is appropriately selected, it is possible to select a barrier metal with an appropriate barrier height $\phi_b$. For example, an injection ratio is set at $10^{-3}$ or more for 100 A/cm$^2$ of Schottky junction total current. The gate electrode 7 is connected to a gate terminal G through a conductor 71 placed through an opening in an emitter electrode 8.

Figure 6:
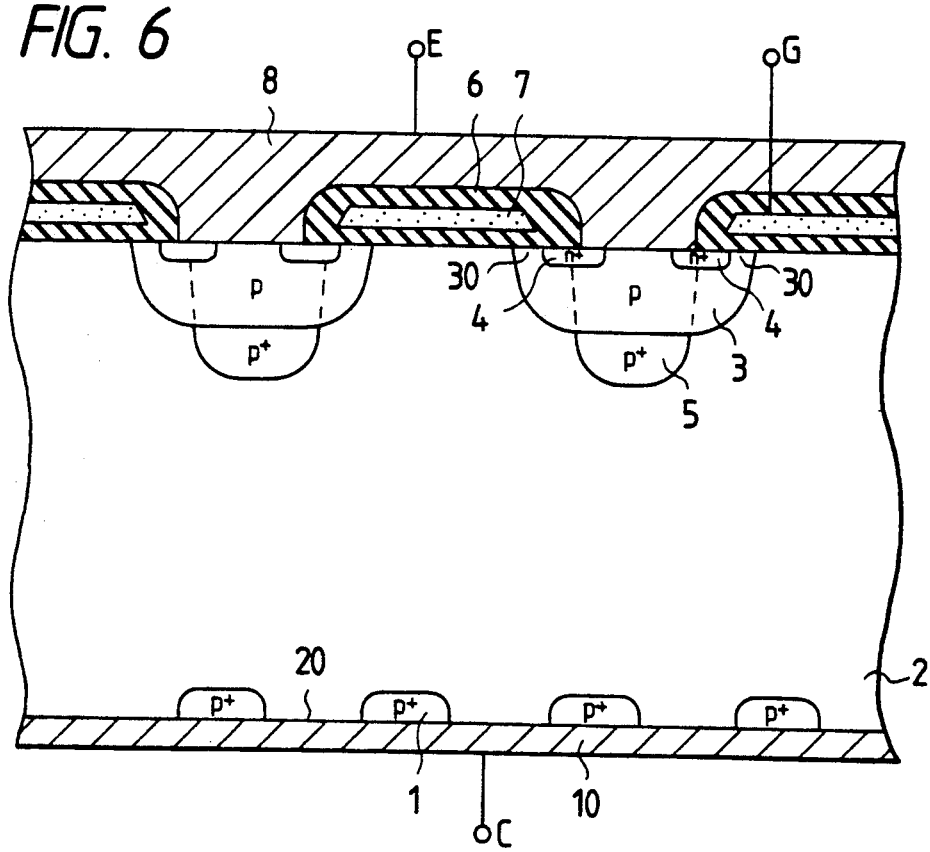
FIG. 6 is a sectional view of a portion of an IGBT according to a further embodiment of the present invention.

FIG. 6 shows a further embodiment of the present invention. This embodiment is preferably used when an increase in the injection amount of hole carriers is desired. In accordance with the embodiment illustrated in FIG. 6, a collector portion includes a Schottky barrier contact 20 and a p$^+$ collector region 1. By varying the area ratio of these parts, a minority carrier injection ratio can be varied. Further, the pull-out of carriers stored in n$^-$ region 2 can also be controlled.

A manufacturing process for manufacturing the metal collector IGBT is described next. To improve the performance of the IGBT, it is preferable to use a minimum width of the n$^-$ high resistance layer 2 for obtaining the necessary breakdown voltage. A thickness of n$^-$ layer 2 in the range of approximately 10 to 15 $\mu$m suffices when an impurity concentration of the n$^-$ region is $10^{14}$ cm$^{-3}$. However, it is impractical to use a wafer of such width in the manufacturing process because handling such a thin, fragile wafer in the initial processing stages creates problems.

Figure 7A:
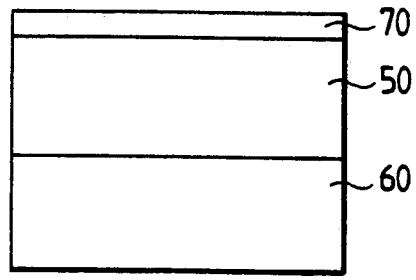
FIGS. 7(a)-7(c) are views showing parts of a process for forming an IGBT of the present invention.
Figure 7B:
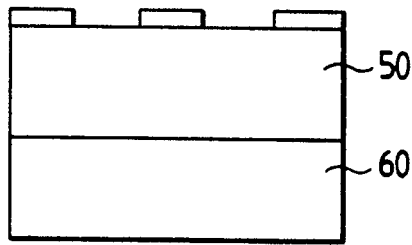
Figure 7C:
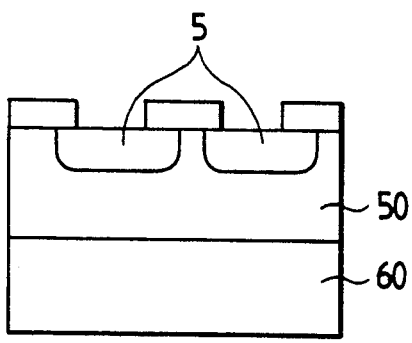

To avoid such a problems, the following manufacturing process is employed (see FIGS. 7(a)–7(c)). An FZ neutron irradiated wafer 50, which is made from a single crystal rod manufactured by a Floating Zone method and doped through neutron irradiation, of n$^-$ conductivity type, with an impurity concentration $8 \times 10$ cm$^{-3}$, and of <100> crystal axis is first prepared. To prepare the FZ wafer, an n-type diffusion region with a surface impurity concentration of approximately $10^{15}$ cm$^{-3}$ and depth of about 50 $\mu$m, is formed in a wafer of 200 to 250 $\mu$m thick by an ion implantation process. The resultant FZ wafer is bonded to a CZ wafer 60, which is made from a single crystal manufactured by a Czochralski method, of about 300 $\mu$m thick with an SiO$_2$ film being interlayered therebetween. As a result, a resultant wafer of about 500 $\mu$m thick is formed.

Next, a field oxide film 70 is formed on the FZ wafer surface of the resultant wafer (see FIG. 7(a)), the oxide film is patterned by a photo process (see FIG. 7(b)), and a p$^+$ well 5 of about 8 $\mu$m deep is formed (see FIG. 7(c)), which is to he part of a base diffusion layer. Thereafter, the gate oxide film 6 of 800 Å is formed. A gate electrode 7 as a polycrystalline silicon film of 10000 Å is then formed over the gate oxide film 6.

With the gate electrode film serving as a mask, a p-base diffusion region 3 of 5 $\mu$m deep is formed. Then, an n$^+$ source diffusion region 4 of 0.25 $\mu$m deep is formed through the same mask. In this manner, a channel region 30 is formed underlying the gate electrode 7. In the case of the IGBT of FIG. 5, after forming the channel region, a CVD oxide film is grown and a contact hole is opened therein, and then Al-Si alloy is deposited so that an emitter electrode 8 and a gate connection conductor 71 are formed. Next, the reverse side of the structure is rubbed off until an n-diffusion layer 11 (whose surface impurity concentration is about $10^{15}$ cm$^{-3}$) of the FZ wafer appears. The resultant reverse side is polished, and a film 10 of Pt or Pt silicide is formed thereover. At this point, the manufacturing process is completed.

As seen from the foregoing description, an electrode to form a Schottky barrier junction is in contact with the surface of an n-type semiconductor substrate, which is opposite to the surface of the substrate which contains an insulating gate in the vertical DMOS structure. A barrier height of the Schottky barrier metal is properly selected, so that a trade-off relation of an ON-voltage vs. switching time of the IGBT can be markedly improved. Further, one of the stray pnp bipolar transistors is changed from a pn junction bipolar transistor to a Schottky junction emitter bipolar transistor. As a result, the current gain of the stray transistor is considerably reduced, and the risk of the occurrence of the latching phenomenon experienced in the conventional IGBT is greatly reduced.

Additional advantages and modifications will readily occur to those skilled in the art. The invention in its broader aspects is therefore not limited to the specific details, representative apparatus and illustrative examples show and described. Accordingly, departures may be made from such details without departing from the spirit and scope of the Applicant's general inventive concept.

What is claimed is:

1. A method for manufacturing a conductivity modulation MOSFET, comprising the steps of:

forming a diffusion region of a first conductivity type by implanting ions in an FZ semiconductor wafer;

bonding the FZ wafer to a CZ wafer with a silicon dioxide film interlayered therebetween to form a resultant wafer;

forming a field oxide film on an FZ wafer surface of the resultant wafer;

forming a well having a high impurity concentration of a second conductivity type in a portion of the FZ wafer surface;

forming a gate oxide film on a region of the FZ wafer surface adjacent the well;

forming a polycrystalline silicon film over the gate oxide film to serve as a gate electrode;

forming, with the gate electrode serving as a mask, a base diffusion region of the second conductivity type in a portion of the FZ wafer surface including the well; and forming, in the base diffusion region, a source region having a high impurity concentration of the first conductivity type.

2. A method for manufacturing a conductivity modulation MOSFET according to the method of claim 1, further comprising the steps of:

removing a side of said resultant wafer opposite said FZ wafer surface to expose a layer of said FZ wafer; and forming a film of Pt or Pt silicide on a surface of said exposed layer.

3. A method for manufacturing a conductivity modulation MOSFET according to the method of claim 1, wherein said step of forming a diffusion region comprises forming by implanting ions a region of a first conductivity type having a surface impurity concentration of about $10^{15}$ cm$^{-3}$ and a depth of about 50 μm in an FZ semiconductor wafer 200 to 250 μm thick.

4. A method for manufacturing a conductivity modulation MOSFET according to the method of claim 1, wherein said step of forming a well includes the steps of:

patterning said oxide film by a photo process; and forming a well of high impurity concentration of the second conductivity type about 8 μm deep in said resultant wafer.

5. A method for manufacturing a conductivity modulation MOSFET according to the method of claim 1, wherein said step of forming a gate oxide film comprises forming a gate oxide film 800 Å thick.

6. A method for manufacturing a conductivity modulation MOSFET according to the method of claim 1, wherein said step of forming a polycrystalline film comprises forming a polycrystalline film 10,000 Å thick over said gate oxide film.

7. A method for manufacturing a conductivity modulation MOSFET according to the method of claim 1, wherein said step of forming a source region includes forming a source region 0.25 μm deep in a portion of said FZ wafer surface.

* * * * *